(12) United States Patent
Mou et al.

(10) Patent No.: US 11,889,764 B2
(45) Date of Patent: Jan. 30, 2024

(54) PIEZOELECTRIC ACTUATOR

(71) Applicant: Microjet Technology Co., Ltd., Hsinchu (TW)

(72) Inventors: Hao-Jan Mou, Hsinchu (TW); Shih-Chang Chen, Hsinchu (TW); Jia-Yu Liao, Hsinchu (TW); Hung-Hsin Liao, Hsinchu (TW); Che-Wei Huang, Hsinchu (TW); Chi-Feng Huang, Hsinchu (TW); Yung-Lung Han, Hsinchu (TW); Chun-Yi Kuo, Hsinchu (TW); Wei-Ming Lee, Hsinchu (TW)

(73) Assignee: Microjet Technology Co., Ltd., Hsinchu (TW)

( * ) Notice: Subject to any disclaimer, the term of this patent is extended or adjusted under 35 U.S.C. 154(b) by 335 days.

(21) Appl. No.: 17/349,249

(22) Filed: Jun. 16, 2021

(65) Prior Publication Data
US 2021/0408362 A1    Dec. 30, 2021

(30) Foreign Application Priority Data
Jun. 30, 2020   (TW) ................... 109122143

(51) Int. Cl.
| H01L 41/053 | (2006.01) |
| H10N 30/20 | (2023.01) |
| H10N 30/88 | (2023.01) |

(52) U.S. Cl.
CPC ............. *H10N 30/20* (2023.02); *H10N 30/88* (2023.02)

(58) Field of Classification Search
CPC ....... H10N 30/20; H10N 30/857; H01L 41/09

USPC ........................................................ 310/328
See application file for complete search history.

(56) References Cited

U.S. PATENT DOCUMENTS

2017/0218941 A1*   8/2017   Chen .................. F16K 99/0048

FOREIGN PATENT DOCUMENTS

| CN | 107023464 A | 8/2017 |
| CN | 107023488 A | 8/2017 |
| CN | 107023489 A | 8/2017 |
| CN | 107795465 A | 3/2018 |
| CN | 107800326 A | 3/2018 |
| CN | 108071579 A | 5/2018 |
| TW | 201932712 A | 8/2019 |

* cited by examiner

*Primary Examiner* — Derek J Rosenau
(74) *Attorney, Agent, or Firm* — Birch, Stewart, Kolasch & Birch, LLP

(57) ABSTRACT

A piezoelectric actuator includes a square suspension plate, an outer frame, a plurality of brackets and a square piezoelectric ceramic plate. The outer frame is arranged around the suspension plate. A second surface of the outer frame and a second surface of the suspension plate are coplanar with each other. Each of the plurality of brackets has two ends, a first end is perpendicular to and connected with the suspension plate, and a second end is perpendicular to and connected with the outer frame for elastically supporting the suspension plate. Each bracket has a length in a range between 1.22 mm and 1.45 mm and a width in a range between 0.2 mm and 0.6 mm. A length of the piezoelectric ceramic plate is not larger than a length of the suspension plate. The piezoelectric ceramic plate is attached on a first surface of the suspension plate.

5 Claims, 9 Drawing Sheets

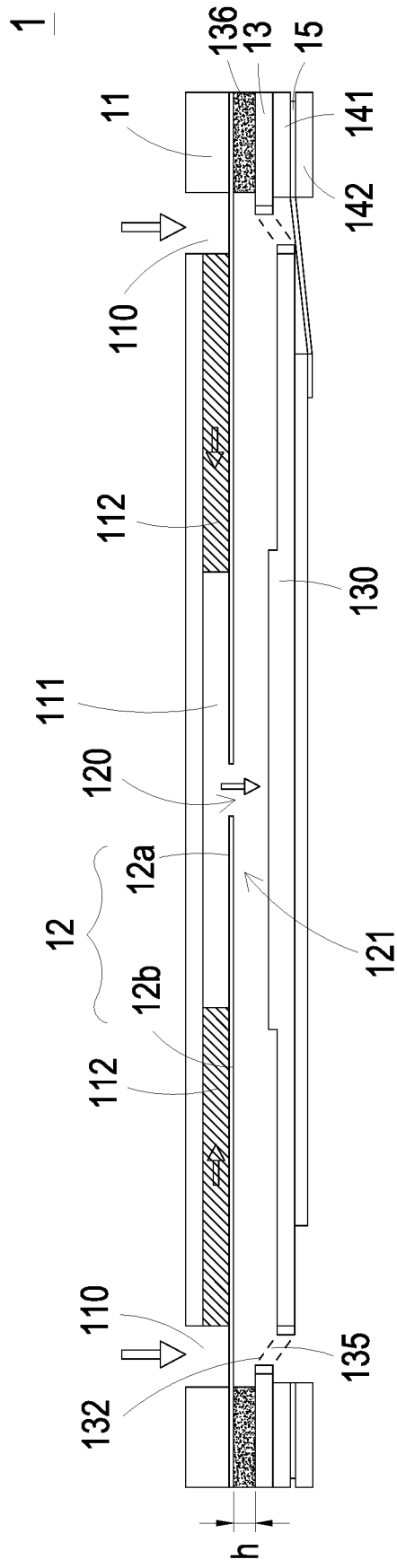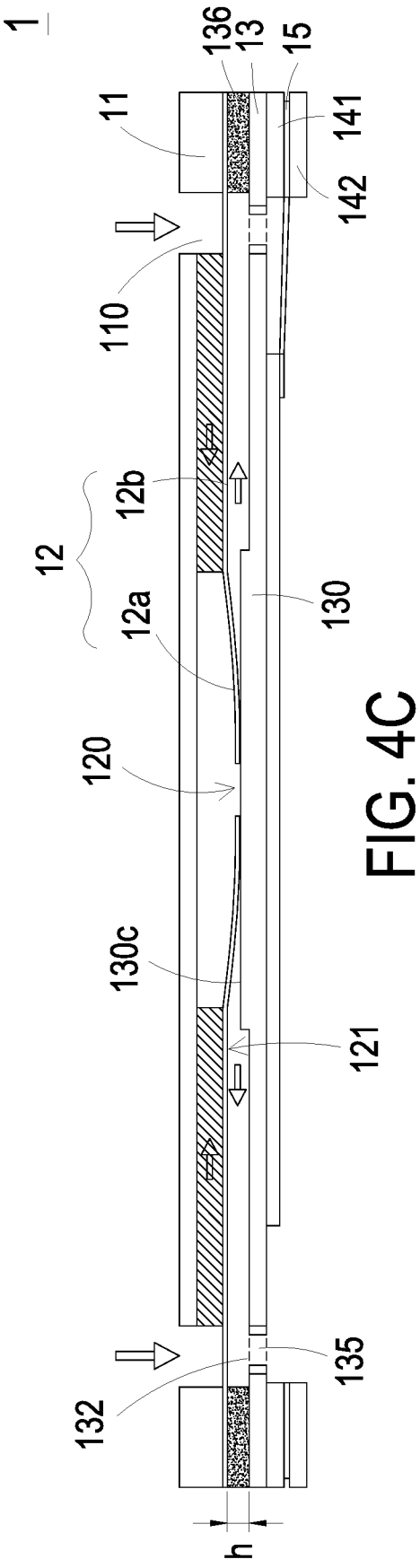

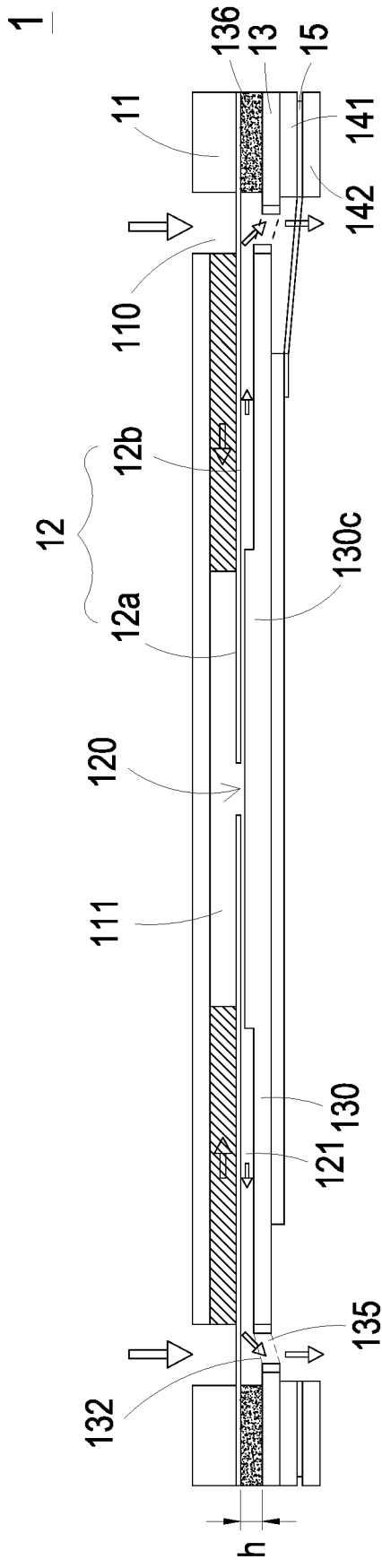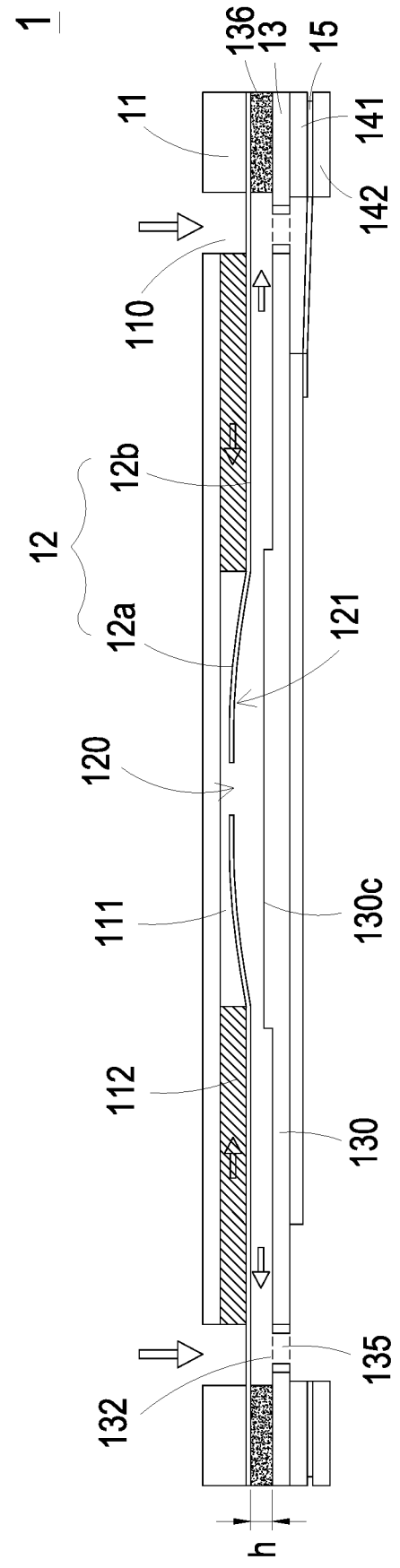

PIEZOELECTRIC ACTUATOR

FIELD OF THE INVENTION

The present invention relates to a piezoelectric actuator, and more particularly to a slim and silent piezoelectric actuator for a miniature fluid control device.

BACKGROUND OF THE INVENTION

With the advancement of science and technology, fluid transportation devices used in many sectors such as pharmaceutical industries, computer techniques, printing industries or energy industries are developed toward elaboration and miniaturization. The fluid transportation devices are important components that are used in, for example, micro pumps, micro atomizers, printheads or industrial printers. Therefore, it is important to provide an improved structure of the fluid transportation device.

For example, in the pharmaceutical industries, pneumatic devices or pneumatic machines use motors or pressure valves to transfer gases. However, due to the volume limitations of the motors and the pressure valves, the pneumatic devices or the pneumatic machines are bulky in volume. In other words, the conventional pneumatic device fails to meet the miniaturization requirement, can't be installed in or cooperated with a portable equipment, and is not portable. Moreover, during operations of the motor or the pressure valve, annoying noise is readily generated. That is, the conventional pneumatic device is neither friendly nor comfortable to the user.

Therefore, there is a need of providing a piezoelectric actuator for a miniature fluid control device with small, miniature, silent, portable and comfortable benefits in order to eliminate the above drawbacks.

SUMMARY OF THE INVENTION

An object of the present invention is to provide a piezoelectric actuator of miniature fluid control device for portable and/or wearable equipment. The piezoelectric actuator comprises a suspension plate, an outer frame, four brackets and a piezoelectric ceramic plate. The brackets are perpendicularly connected between the suspension plate and the outer frame for elastically supporting the suspension plate, so as to decrease the non-uniform motion such as deflecting waggling of the suspension plate, therefore increases the amplitude of the suspension plate along the Z axis, and enhances the stability and consistence of the motion of the suspension plate in the vertical direction during operation. As a result, the stability and performance of the piezoelectric actuator can be elevated.

Another object of the present invention is to provide a piezoelectric actuator of a miniature fluid control device for applying to a portable device or wearable equipment. The integral metal plate corresponding to a suspension plate, an outer frame and at least one bracket of a piezoelectric actuator are etched to the same etch depth, and thus the integral structure of the suspension plate, the outer frame and the at least one bracket is defined as coplanar with each other. In comparison with the conventional way using the multiple-step etching process, the process of forming the piezoelectric actuator of the present invention is simplified. In accordance with the present invention, an adhesive layer is filled into the gap between a resonance plate and the outer frame. Since the outer frame after being etched has a rough surface, the adhesion strength between the adhesive layer and the outer frame is increased. Moreover, since the thickness of the outer frame decreases, the thickness of the adhesive layer in the gap can be increased as compared with the conventional outer frame of the piezoelectric actuator, so as to improve the coating uniformity of the adhesive layer, decrease the assembling error of the suspension plate in the horizontal direction, improve the efficiency of utilizing the kinetic energy of the suspension plate in the vertical direction and absorb vibration energy so as to reduce noise. Due to the benefits of slim, silent and power-saving mentioned above, the miniature fluid control device of the present invention is suitably used in the wearable device.

A further object of the present invention is to provide a piezoelectric actuator of a miniature fluid control device for applying to a portable device or wearable equipment. A suspension plate of the piezoelectric actuator is a square plate with a bulge. After an external fluid is introduced into an inlet of the gas inlet plate of a base, the fluid is guided to a central cavity through a convergence channel, and then the fluid is transferred to a compressible chamber between the resonance plate and the piezoelectric actuator through the central aperture of the resonance plate and generate a pressure gradient in the compressible chamber to facilitate the fluid to flow at a high speed. Since the flowrate would not be reduced and no pressure loss is resulted, the pressure could be transmit and accumulated to achieve higher discharge pressure accordingly.

In accordance with an aspect of the present invention, there is provided a piezoelectric actuator including a square suspension plate, an outer frame, a plurality of brackets and a square piezoelectric ceramic plate. The square suspension plate has a central portion and a periphery portion. The suspension plate is permitted to undergo a curvy vibration from the central portion to the periphery portion. The outer frame is arranged around the suspension plate. Each of the plurality of brackets has two ends. A first end of the bracket is perpendicular to and connected with the suspension plate. A second end of the bracket is perpendicular to and connected with the outer frame for elastically supporting the suspension plate. Each bracket has a length in a range between 1.22 mm and 1.45 mm and a width in a range between 0.2 mm and 0.6 mm. The maximum length of the piezoelectric ceramic plate is not larger than a length of a side of the square shape of the suspension plate. The piezoelectric ceramic plate is attached on a first surface of the suspension plate. When a voltage is applied to the piezoelectric ceramic plate, the suspension plate is driven to undergo the curvy vibration.

BRIEF DESCRIPTION OF THE DRAWINGS

The above contents of the present disclosure will become more readily apparent to those ordinarily skilled in the art after reviewing the following detailed description and accompanying drawings, in which:

FIGS. 4A to 4E schematically illustrate the operation steps of the miniature fluid control device of FIG. 1A.

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a piezoelectric actuator 13 of a miniature fluid control device 1. The miniature fluid control device 1 may be used in many sectors such as pharmaceutical industries, energy industries, computer techniques or printing industries for transporting fluid.

Figure 1A:
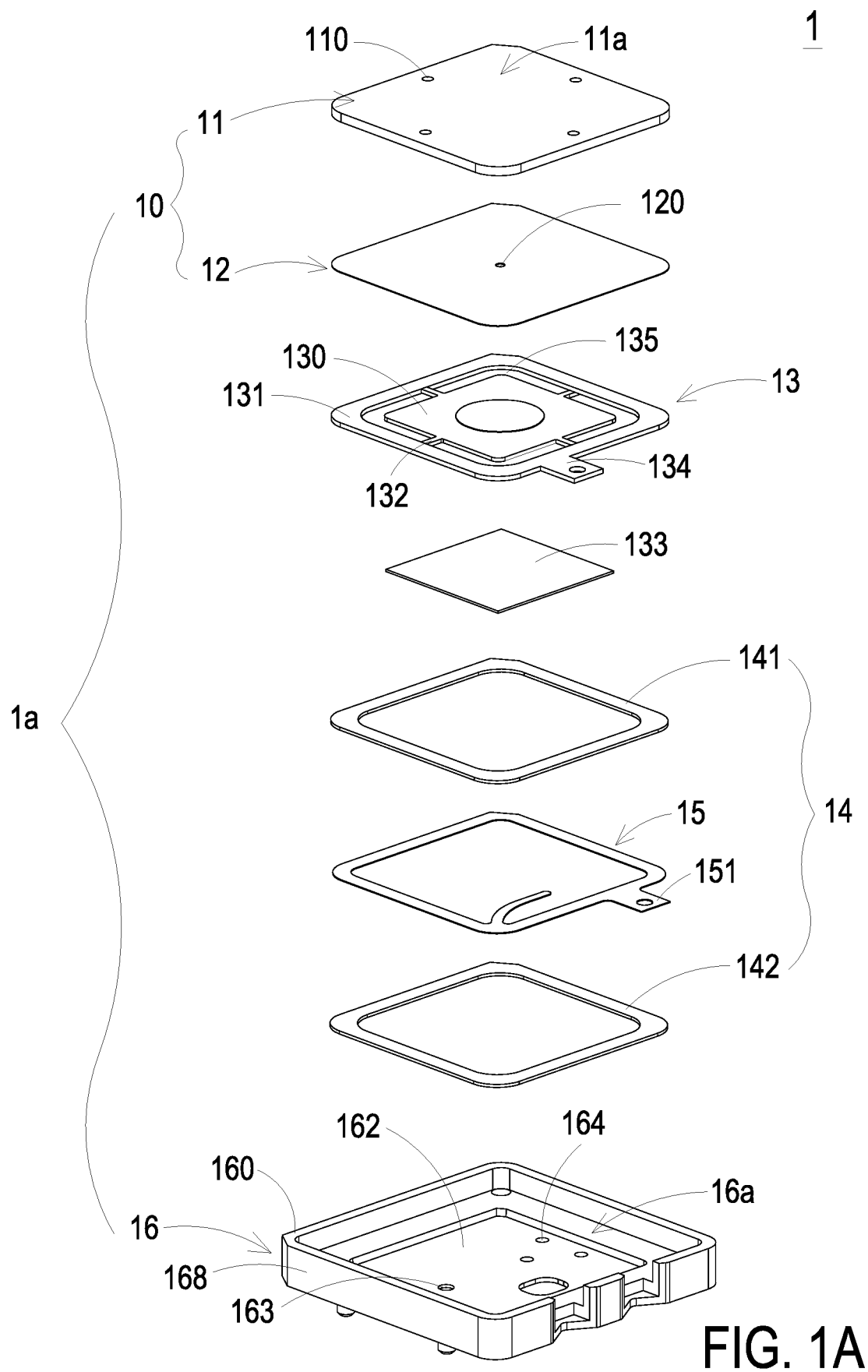
FIG. 1A is a schematic exploded front view illustrating a miniature fluid control device according to an embodiment of the present invention.
Figure 1B:
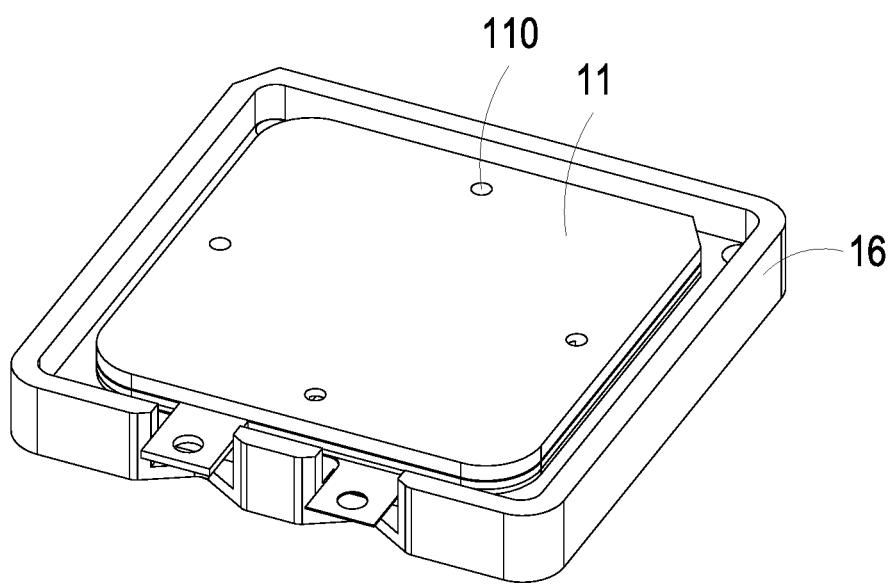
FIG. 1B is a schematic perspective front view illustrating the assembled structure of the miniature fluid control device of FIG. 1A.
Figure 2A:
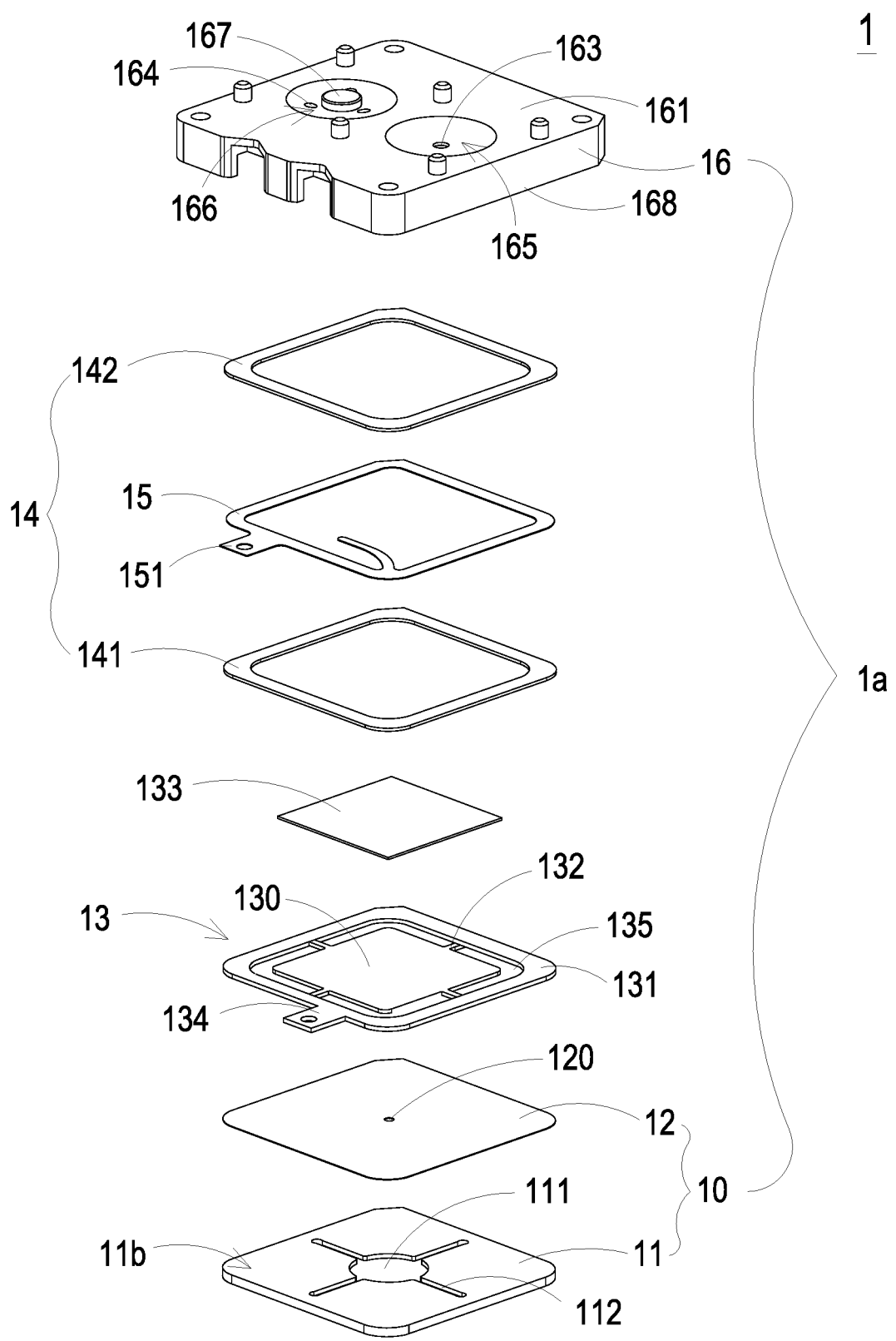
FIG. 2A is a schematic exploded back view illustrating the miniature fluid control device of FIG. 1A.
Figure 2B:
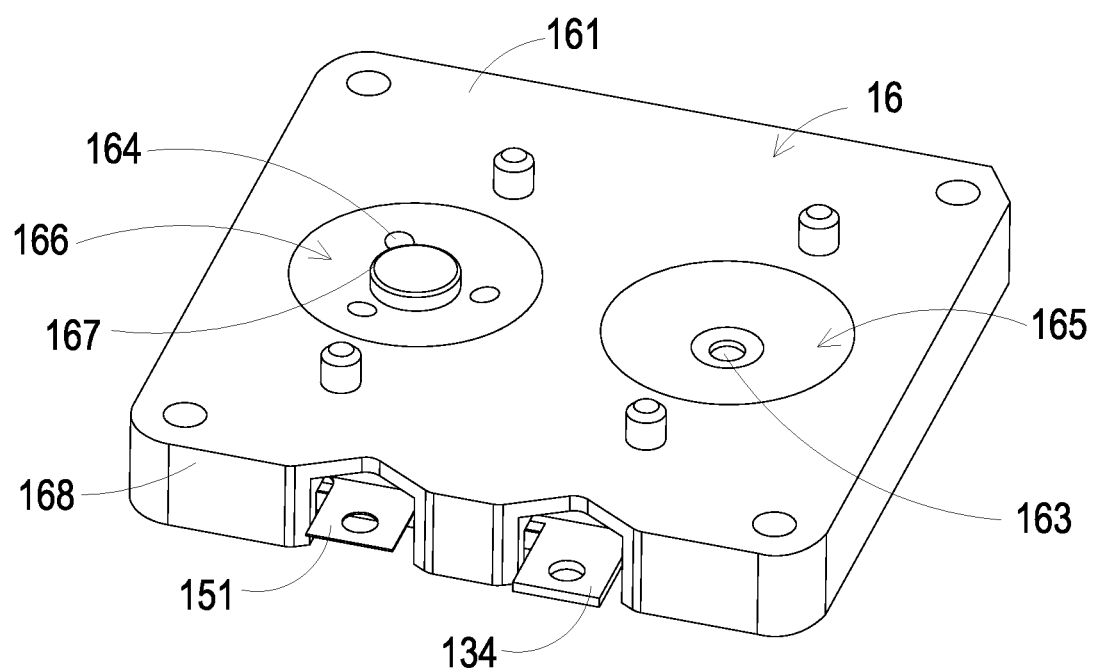
FIG. 2B is a schematic perspective back view illustrating the assembled structure of the miniature fluid control device of FIG. 2A.
Figure 5:
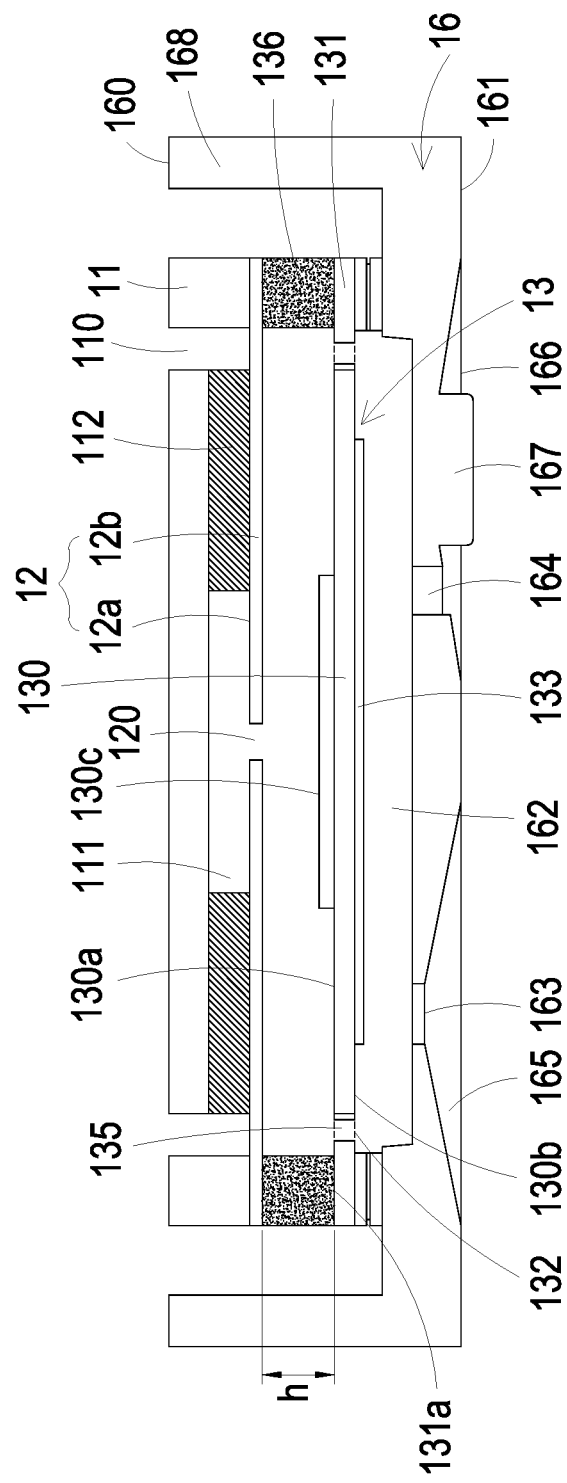
FIG. 5 is a schematic cross-sectional view illustrating the miniature fluid control device of FIG. 1B.

Please refer to FIGS. 1A, 1B, 2A, 2B and 5. FIG. 1A is a schematic exploded front view illustrating a miniature fluid control device according to an embodiment of the present invention. FIG. 1B is a schematic perspective front view illustrating the assembled structure of the miniature fluid control device of FIG. 1A. FIG. 2A is a schematic exploded back view illustrating the miniature fluid control device of FIG. 1A. FIG. 2B is a schematic perspective back view illustrating the assembled structure of the miniature fluid control device of FIG. 2A. FIG. 5 is a schematic cross-sectional view illustrating the miniature fluid control device of FIG. 1B.

As shown in FIGS. 1A, 2A and 5, the miniature fluid control device 1 comprises a housing 1a, a piezoelectric actuator 13, a first insulation plate 141, a conducting plate 15 and a second insulation plate 142. The housing 1a comprises a gas collecting plate 16 and a base 10. The base 10 comprises a gas inlet plate 11 and a resonance plate 12. The piezoelectric actuator 13 is aligned with the resonance plate 12. The gas inlet plate 11, the resonance plate 12, the piezoelectric actuator 13, the first insulation plate 141, the conducting plate 15, the second insulation plate 142 and the gas collecting plate 16 are stacked on each other sequentially. Moreover, the piezoelectric actuator 13 comprises a suspension plate 130, an outer frame 131, at least one bracket 132 and a piezoelectric ceramic plate 133.

As shown in FIG. 1A and FIG. 5, the gas collecting plate 16 is a frame body formed with a bottom plate and a sidewall structure 168. The sidewall structure 168 extending from the edges of the bottom plate. An accommodation space 16a is defined by the bottom plate and the sidewall structure 168 collaboratively, and the piezoelectric actuator 13 is disposed within the accommodation space 16a.

The gas collecting plate 16 comprises a first surface 160 and a second surface 161 (also referred as a fiducial surface). The first surface 160 of the gas collecting plate 16 is concaved to define a gas-collecting chamber 162. The fluid transferred downwardly by the miniature fluid control device 1 is temporarily accumulated in the gas-collecting chamber 162. The gas collecting plate 16 comprises a first perforation 163 and a second perforation 164. A first end of the first perforation 163 and a first end of the second perforation 164 are in communication with the gas-collecting chamber 162. A second end of the first perforation 163 is in communication with a first pressure-releasing chamber 165, and a second end of the second perforation 164 is in communication with a first outlet chamber 166, while the first pressure-releasing chamber 165 and the first outlet chamber 166 are formed on the second surface 161 of the gas collecting plate 16. Moreover, a raised structure 167 is disposed in the first outlet chamber 166, while the raised structure 167 includes but is not limited to a cylindrical post.

As shown in FIG. 2A, the piezoelectric actuator 13 comprises a suspension plate 130, an outer frame 131, four brackets 132 and a piezoelectric ceramic plate 133. In this embodiment, the piezoelectric ceramic plate 133 also has a square shape. The length of the piezoelectric ceramic plate 133 is less than or equal to the length of the suspension plate 130. Moreover, the piezoelectric ceramic plate 133 is attached on the suspension plate 130. In this embodiment, the suspension plate 130 is a flexible square plate structure. The outer frame 131 is arranged around the suspension plate 130. The profile of the outer frame 131 is substantially corresponding to the profile of the suspension plate 130. That is, the outer frame 131 is a square hollow frame. Moreover, the four brackets 132 are connected between the suspension plate 130 and the outer frame 131 for elastically supporting the suspension plate 130.

Please refer to FIGS. 1A and 2A again. The miniature fluid control device 1 further comprises the first insulation plate 141, the conducting plate 15 and the second insulation plate 142. The conducting plate 15 is sandwiched between the first insulation plate 141 and the second insulation plate 142. As shown in FIGS. 1A, 1B. 2A and 2B, as assembling the miniature fluid control device 1, the second insulation plate 142, the conducting plate 15, the first insulation plate 141, the piezoelectric actuator 13 and the base 10 are assembled together and accommodated within the accommodation space 16a of the gas collecting plate 16. The resulting structure of the miniature fluid control device 1 is shown in FIGS. 1B and 2B. The miniature fluid control device 1 of the present invention with a miniature profile is provided through above mentioned configuration.

Please refer to FIGS. 1A and 2A again. The gas inlet plate 11 of the miniature fluid control device 1 comprises a first surface 11b, a second surface 11a and at least one inlet 110. In this embodiment, the gas inlet plate 11 has four inlets 110, but not limited thereto. The inlets 110 run through the gas inlet plate 11 from the first surface 11b to the second surface 11a, for allowing the fluid to be introduced into the miniature fluid control device 1 through the inlets 110 in response to the action of the atmospheric pressure. As shown in FIG. 2A, there are at least one convergence channel 112 formed on the first surface 11b of the gas inlet plate 11, while there are four convergence channels 112 in this embodiment. The at least one convergence channel 112 is in communication with the at least one inlet 110 on the second surface 11a of the gas inlet plate 11. In this embodiment, each of the convergence channels 112 is in communication with the corresponding inlets 110. Moreover, a central cavity 111 is formed on the first surface 11b of the gas inlet plate 11. The central cavity 111 is in communication with the at least one convergence channel 112. Furthermore, the central cavity 111 is formed on the central of the gas inlet plate 11 to converge the convergence channels 112. After the fluid is introduced into the at least one convergence channel 112 through the at least one inlet 110, the fluid is guided into the central cavity 111. In this embodiment, the at least one inlet 110, the at least one convergence channel 112 and the central cavity 111 of the gas inlet plate 11 are integrally formed. After the gas inlet plate 11 and the resonance plate 12 are assembled, a convergence chamber for temporarily storing the fluid is formed between the central cavity 111 and the resonance plate 12. Preferably but not exclusively, the gas inlet plate 11 is made of stainless steel. The thickness of the gas inlet plate 11 is in the range between 0.4 mm and 0.6 mm, and preferably 0.5 mm. In addition, the depth of the convergence chamber defined by the central cavity 111 is equal to the depth of the at least one convergence channel 112.

Preferably but not exclusively, the resonance plate 12 is made of a flexible material, but not limited thereto. The resonance plate 12 comprises a central aperture 120 corresponding to the central cavity 111 of the gas inlet plate 11. Consequently, the fluid can be transferred through the central aperture 120. Preferably but not exclusively, the resonance plate 12 is made of copper, but not limited thereto. The thickness of the resonance plate 12 is in the range between 0.03 mm and 0.08 mm, and preferably 0.05 mm.

Figure 4A:
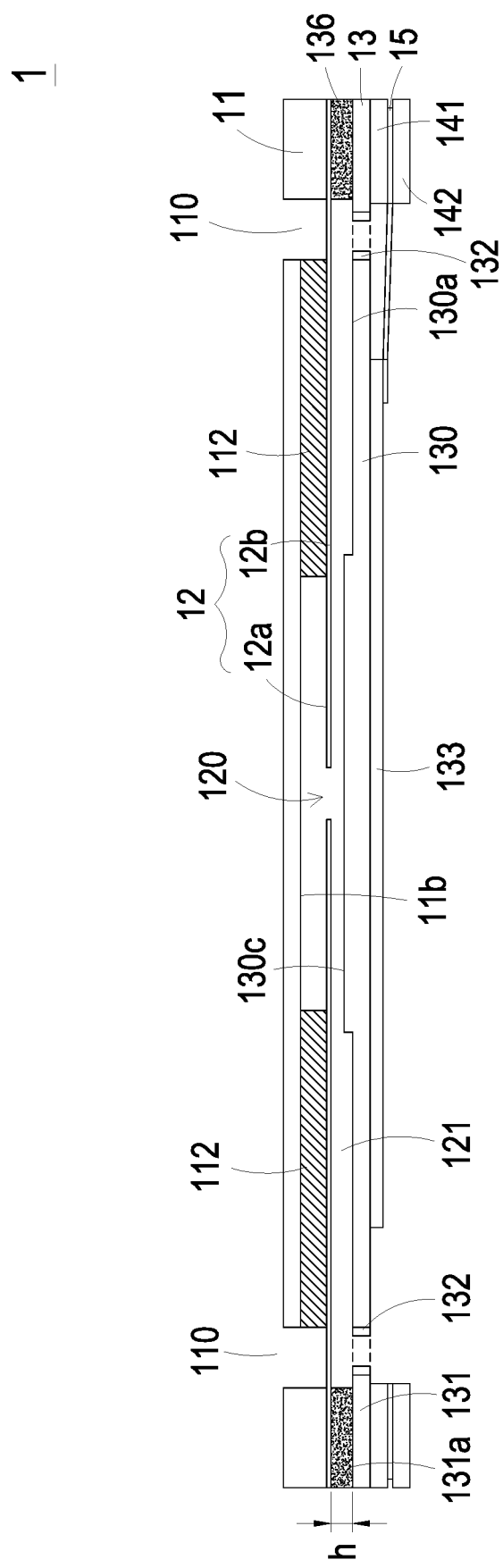

As shown in FIGS. 4A and 5, there is a gap h between the resonance plate 12 and the outer frame 131 of the piezoelectric actuator 13. An adhesive layer 136, which is preferably but not limited to a conductive adhesive, is filled into the gap h. Consequently, the depth of the gap h between the resonance plate 12 and the suspension plate 130 can be maintained to guide and allow the fluid to flow more quickly. Moreover, due to the depth of the gap h, a compressible chamber 121 is defined between the resonance plate 12 and the suspension plate 130, thereby guides the fluid to enter the compressible chamber 121 via the central aperture 120 of the resonance plate 12, and allows the fluid to flow more rapidly. In addition, since the proper distance between the resonance plate 12 and the suspension plate 130 is maintained, the contact interference therebetween can be diminished and largely reduces the generated noise.

Please refer to FIGS. 1A and 2A again. The miniature fluid control device 1 further comprises the first insulation plate 141, the conducting plate 15 and the second insulation plate 142 stacked on each other and sandwiched between the piezoelectric actuator 13 and the gas collecting plate 16. The profiles of the first insulation plate 141, the conducting plate 15 and the second insulation plate 142 are substantially corresponding to the profile of the outer frame 131 of the piezoelectric actuator 13. The first insulation plate 141 and the second insulation plate 142 are made of an insulating material (e.g. a plastic material), but not limited thereto. The conducting plate 15 is made of an electrically conductive material (e.g. a metallic material), but not limited thereto. Moreover, the conducting plate 15 has a conducting pin 151 so as to be electrically connected with an external circuit (not shown).

Figure 3A:
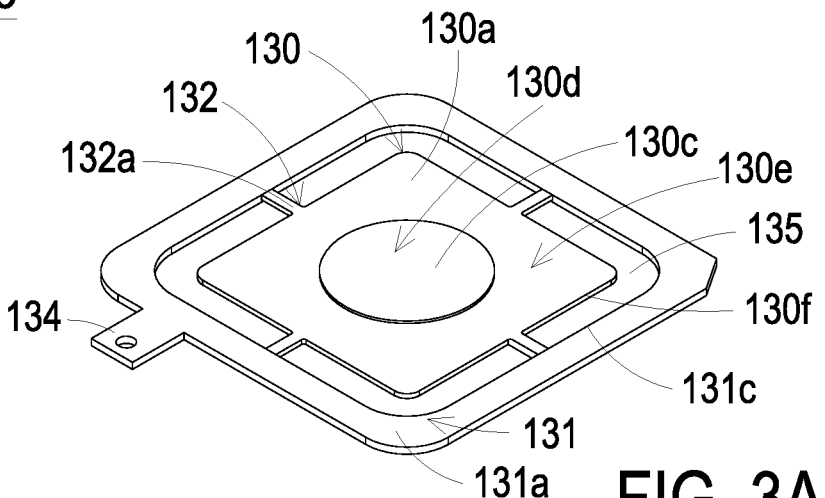
FIG. 3A is a schematic perspective front view illustrating the piezoelectric actuator of the miniature fluid control device of FIG. 1A.
Figure 3B:
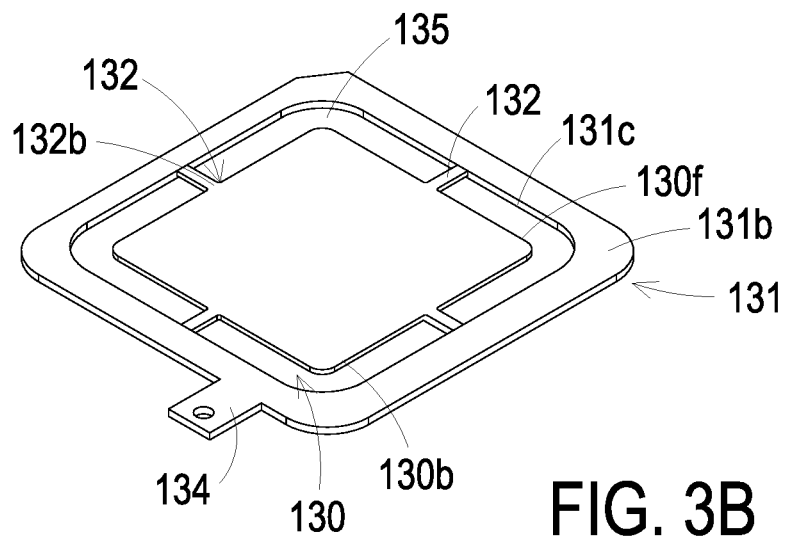
FIG. 3B is a schematic perspective back view illustrating the piezoelectric actuator of the miniature fluid control device of FIG. 1A.
Figure 3C:
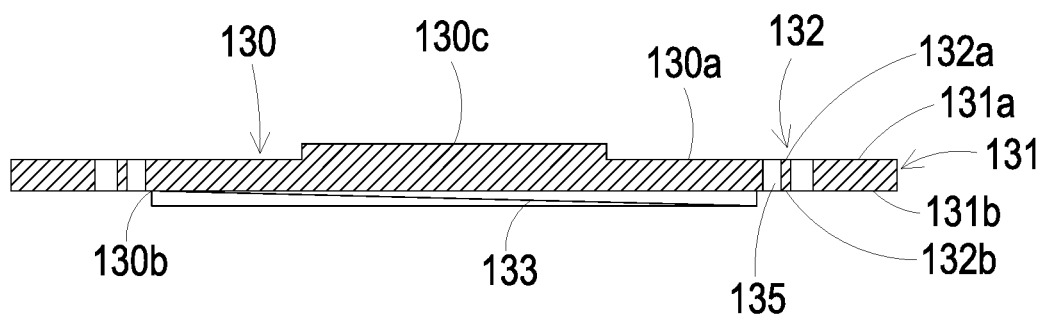
FIG. 3C is a schematic cross-sectional view illustrating the piezoelectric actuator of the miniature fluid control device of FIG. 1A.

Referring to FIGS. 3A, 3B and 3C, the piezoelectric actuator 13 is assembled by the suspension plate 130, the outer frame 131, the plurality of brackets 132, and the piezoelectric ceramic plate 133. In this embodiment, the plurality of brackets are four brackets, but not limited thereto, while the number of the brackets may be varied according to the practical requirements. Moreover, the suspension plate 130, the four brackets 132 and the outer frame 131 are integrally formed and produced from a metal plate (e.g., a stainless steel plate but not limited thereto). That is, the piezoelectric actuator 13 of the miniature fluid control device 1 is made by attaching the piezoelectric ceramic plate 133 to the processed metal plate but not limited thereto. The suspension plate 130 comprises a first surface 130b and an opposite second surface 130a. The piezoelectric ceramic plate 133 is attached on the first surface 130b of the suspension plate 130. When a voltage is applied to the piezoelectric ceramic plate 133, the piezoelectric ceramic plate 133 drives the suspension plate 130 to generate a curvy vibration. As shown in FIG. 3A, the suspension plate 130 comprises a central portion 130d and a periphery portion 130e. When the piezoelectric ceramic plate 133 is driven by a drive voltage, the suspension plate 130 is subjected to the curvy vibration from the central portion 130d to the periphery portion 130e. The outer frame 131 is arranged around the peripheral of the suspension plate 130. Moreover, a conducting pin 134 protrudes outwardly from the outer frame 131 so as to be electrically connected with an external circuit (not shown).

The four brackets 132 are connected between the suspension plate 130 and the outer frame 131 for elastically supporting the suspension plate 130, wherein the four brackets 132 are perpendicular to the suspension plate 130 and the outer frame 131, as the lateral rim 130f of the suspension plate 130 and the corresponding inner rim 131c of the outer frame 131 are in parallel with each other. A first end of the bracket 132 is perpendicular to and connected with the corresponding lateral rim 130f of the suspension plate 130. A second end of the bracket 132 is perpendicular to and connected with the corresponding inner rim 131c of the outer frame 131. Moreover, at least one vacant space 135 is formed between the brackets 132, the suspension plate 130 and the outer frame 131 for allowing the fluid to go through. The types of the suspension plate 130 and the outer frame 131 and the type and the number of the brackets 132 may be varied according to the practical requirements. Since the brackets 132 are perpendicularly connected between the suspension plate 130 and the outer frame 131, the non-uniform motion such as deflecting waggling of the suspension plate 130 can be decreased, therefore increases the amplitude of the suspension plate 130 along the Z axis, and enhances the stability and consistence of the motion of the suspension plate 130 in the vertical direction during operation. As a result, the stability and performance of the piezoelectric actuator 13 can be enhanced.

In the piezoelectric actuator 13 of the embodiment, the performance of the miniature fluid control device is various with different dimensions of brackets 132. In this embodiment, the brackets 132 with the length in the range between 1.22 mm and 1.45 mm (preferably 1.30 mm) and the width in the range between 0.2 mm and 0.6 mm (preferably 0.45 mm) have better performance.

As shown in FIGS. 3A and 3C, the second surface 130a of the suspension plate 130 is coplanar with a second surface 131a of the outer frame 131 and a second surface 132a of the bracket 132. In this embodiment, the suspension plate 130 is a square plate structure. The length of the suspension plate 130 is in the range between 7.5 mm and 12 mm, and preferably in the range between 9 mm and 10 mm. The thickness of the suspension plate 130 is in the range between 0.1 mm and 0.4 mm, and preferably 0.27 mm. The thickness of the outer frame 131 is also in the range between 0.1 mm and 0.4 mm, but not limited thereto. The length of the piezoelectric ceramic plate 133 is not longer than the length of the suspension plate 130. In this embodiment, the piezoelectric ceramic plate 133 is also a square plate structure corresponding to the suspension plate 130. The thickness of the piezoelectric ceramic plate 133 is in the range between 0.05 mm and 0.3 mm, while the optimum is 0.10 mm.

As mentioned above, the suspension plate 130 of the piezoelectric actuator 13 of the present invention is a square suspension plate. In comparison with the circular suspension plate of the conventional piezoelectric actuator, the square suspension plate is more power-saving. The comparison between the consumed power and the operating frequency for the suspension plates of different types and sizes is shown in Table 1.

TABLE 1

| Type and size of suspension plate | Operating frequency | Consumed power |
|---|---|---|
| Square (side length: 10 mm) | 18 kHz | 1.1 W |
| Circular (diameter: 10 mm) | 28 kHz | 1.5 W |
| Square (side length: 9 mm) | 22 kHz | 1.3 W |
| Circular (diameter: 9 mm) | 34 kHz | 2 W |
| Square (side length: 8 mm) | 27 kHz | 1.5 W |
| Circular (diameter: 8 mm) | 42 kHz | 2.5 W |

From the results of Table 1, it is found that the piezoelectric actuator with the square suspension plate (8 mm~10 mm) is more power-saving than the piezoelectric actuator with the circular suspension plate (8 mm~10 mm). That is, the piezoelectric actuator with the square suspension plate consumes less power. Generally, the consumed power of the capacitive load at the resonance frequency is positively related to the resonance frequency. Since the resonance frequency of the square suspension plate is obviously lower than that of the circular square suspension plate, the consumed power of the square suspension plate is fewer. Due to the properties of slim, silent and power-saving, the miniature fluid control device 1 of the present invention is suitable for using in the wearable device that the property of power-saving is important design concern thereof.

As mentioned above, the suspension plate 130, the outer frame 131 and the four brackets 132 are integrally formed with each other and produced by one of the following means including, but not limited to, a conventional machining process, a photolithography and etching process, a laser machining process, an electroforming process, an electric discharge machining process and so on. In this embodiment, the suspension plate 130, the outer frame 131 and the four brackets 132 are integrally form from a metal plate, and the suspension plate 130, the outer frame 131 and the four brackets 132 respectively corresponding to etched at the same etch depth, such that the second surface 130a of the suspension plate 130, the second surface 131a of the outer frame 131 and the second surfaces 132a of the brackets 132 are coplanar with each other. Through such etching process at the same etch depth, the manufacturing process of conventional piezoelectric actuator needs to be etched in multiple steps to make different depths for forming the outer frame and the suspension plate could be simplified. In accordance with the present invention, the adhesive layer 136 is filled into the gap between the resonance plate 12 and the outer frame 131. Since the outer frame 131 after being etched has a rough surface, the adhesion strength between the adhesive layer 136 and the outer frame 131 is increased. Moreover, since the thickness of the outer frame 131 is lesser than the outer frame of the conventional piezoelectric actuator, the thickness of the adhesive layer 136 in the gap h can be increased and enhance the coating uniformity of the adhesive layer 136, reduce the assembling error of the suspension plate 130 in the horizontal direction, and improve the efficiency of utilizing the kinetic energy of the suspension plate 130 in the vertical direction. Moreover, the increase of the thickness of the adhesive layer 136 is helpful in absorbing vibration energy and reducing noise.

The data of performance and defective rate the miniature fluid control device 1 of the present invention regarding to the different thicknesses of adhesive layers 136 are listed in Table 2.

TABLE 2

| Adhesive thickness | 40 µm | 45 µm | 50 µm | 55 µm | 60 µm | 65 µm | 70 µm |
|---|---|---|---|---|---|---|---|
| Frequency | 28 kHz | 28 kHz | 28 kHz | 28 kHz | 28 kHz | 28 kHz | 28 kHz |
| Maximum output pressure | 50 mmHg | 150 mmHg | 275 mmHg | 350 mmHg | 290 mmHg | 265 mmHg | 145 mmHg |
| Defective rate | 12/25 = 48% | 9/25 = 36% | 3/25 = 12% | 1/25 = 4% | 2/25 = 8% | 10/25 = 40% | 10/25 = 40% |

It can be found from above Table 2 that the performance of the miniature fluid control device is highly influenced by the thickness of the adhesive layer 136. If the thickness of the adhesive layer 136 is too large, although the depth of the gap h and the total volume thereof can be larger, and the compressible chamber 121 deteriorates its compressible efficacy and thus reduces the performance of the miniature fluid control device 1. If the thickness of the adhesive layer 136 is too small, the depth of the gap h is insufficient that the bulge 130c and the resonance plate 12 may collide with each other. Such collision reduces the performance and generates noise, while the noise problem may result in the defectiveness of the products. The results of the above table are obtained from 25 samples of the miniature fluid control device 1 with specified thicknesses of adhesive layers 136. The optimized thickness of the adhesive layer 136 is in the range between 50 µm and 60 µm. In this thickness range, the performance can be largely increased, and the defect rate can be reduced. More preferably, the optimum thickness of the adhesive layer 136 is 55 µm because the performance of the adhesive layer 136 under this size is best and the defect rate is minimum, but not limited thereto.

As shown in FIGS. 3A and 3C, the suspension plate 130 is a stepped structure, having a bulge 130c formed on the central portion 130d of the second surface 130a. The bulge 130c is, but not limited to, be a circular convex structure. The thickness of the bulge 130c is in the range between 0.02 mm and 0.08 mm, and preferably 0.03 mm. Preferably but not exclusively, the diameter of the bulge 130c is 4.95 mm, but not limited thereto.

FIGS. 4A to 4E schematically illustrate the operation steps of the miniature fluid control device of FIG. 1A. Please refer to FIGS. 1A, 4A to 4E and 5. As the base 10, the gas inlet plate 11, the resonance plate 12, the piezoelectric actuator 13, the first insulation plate 141, the conducting plate 15, the second insulation plate 142 and the gas collecting plate 16 are sequentially stacked, a convergence chamber is formed between the resonance plate 12 and the central cavity 111 on the first surface 11b of the gas inlet plate 11, while the compressible chamber 121 is formed between the resonance plate 12 and the suspension plate 130 for temporarily storing the fluid. The compressible chamber 121 is in communication with the convergence chamber 111 through the central aperture 120 of the resonance plate 12. When the piezoelectric actuator 13 is actuated by an applied voltage, the suspension plate 130 of the piezoelectric actuator 13 is vibrated along a vertical direction in a reciprocating manner. The related operation steps of the miniature fluid control device 1 will be described as follows.

Please refer to FIG. 4B. When the suspension plate 130 of the piezoelectric actuator 13 is vibrating downwardly in the process of the reciprocating vibration of, the fluid is fed into the at least one inlet 110 of the gas inlet plate 11, and then transferred to the central cavity 111 of the gas inlet plate 11 through the at least one convergence channel 112. The resonance plate 12, which is light and thin, resonates with the suspension plate 130 pushed by the entering fluid and vibrates along the vertical direction in the reciprocating manner. That is, a movable part 12a of the resonance plate 12 corresponding to the central cavity 111 of the gas inlet plate 11 is subjected to a deformation of curvy vibration.

Please refer to FIG. 4C. When the movable part 12a of the resonance plate 12 is vibrated downwardly to a position that is very close to the bulge 130c of the suspension plate 130 and allows the fluid to be introduced into the compressible chamber 121, the flow rate of the fluid would not being reduced and no pressure loss is generated, since the gap between the region besides the bulge 130c of the suspension plate 130 and the fixed part 12b of the resonance plate 12 remains the same, thereby the volume of the compressible chamber 121 can be compressed more effectively.

As shown in FIG. 4D, the piezoelectric actuator 13 keeps on vibrating reciprocatingly in the vertical direction and bending upwardly, the fluid in the compressible chamber 121 is pushed outwardly toward peripheral regions, and transferred downwardly through the vacant space 135 and of the piezoelectric actuator 13 at a pressure higher than the former existing one in the compressible chamber 121.

As shown in FIG. 4E, as the movable part 12a of the resonance plate 12 moves upwardly along with the upwardly action of the bulge 130c of the suspension plate 130, the convergence chamber 111 is compressed and the volume of the convergence chamber 111 is reduced at the place where the fluid flows from the convergence channel 112 to the central cavity 111.

Finally, when the suspension plate 130 of the piezoelectric actuator 13 keep on vibration reciprocatingly, above-mentioned operation steps depicted from FIG. 4A to FIG. 4E are repeated. In this embodiment, it can be found that the bulge 130c of the suspension plate 130 in the piezoelectric actuator 13 has enhanced the efficiency of transferring the fluid. It is noted that the profile, number and position of the bulge 130c may be varied according to the practical requirements.

In some embodiments, the vibration frequency of the resonance plate 12 in the vertical direction is identical to the vibration frequency of the piezoelectric actuator 13. That is, the resonance plate 12 and the piezoelectric actuator 13 are vibrated simultaneously, i.e. moving upwardly or downwardly at the same time. It is noted that the operation steps of the resonance plate 12 and the piezoelectric actuator 13 may be varied according to the practical requirements.

From the above descriptions, the present invention provides the piezoelectric actuator for a miniature fluid control device. The piezoelectric actuator comprises a suspension plate, an outer frame, four brackets and a piezoelectric ceramic plate. The brackets are perpendicularly connected between the suspension plate and the outer frame for elastically supporting the suspension plate. Such configuration can decrease the non-uniform motion such as deflecting waggling of the suspension plate, therefore increases the amplitude of the suspension plate along the Z axis, and enhances the stability and consistence of the motion of the suspension plate in the vertical direction during operation. As a result, the stability and performance of the piezoelectric actuator are intensified.

Moreover, the suspension plate, the outer frame and the at least one bracket of the piezoelectric are integral metal plate etched at the same etch depth, so as to define the profile of the bulge and bracket, such that the second surface of the suspension plate, the second surface of the outer frame and the second surface of the bracket are coplanar with each other. In comparison with the conventional technology of using the multiple-step etching process for components in different depths, the process of forming the piezoelectric actuator of the present invention can be simplified. In accordance with the present invention, the adhesive layer is filled into the gap between the resonance plate and the outer frame. Since the outer frame after being etched has a rough surface, the adhesion strength between the adhesive layer and the outer frame is increased. Moreover, since the thickness of the outer frame decreased as compared with the outer frame of the conventional piezoelectric actuator, the thickness of the adhesive layer in the gap can be increased. The increase of the thickness of the adhesive layer means that the coating uniformity of the adhesive layer is improved, the assembling error of the suspension plate in the horizontal direction is decreased, and the kinetic energy of the suspension plate in the vertical direction can be effectively utilized. Moreover, the increase of the thickness of the adhesive layer can also assist in absorbing vibration energy and reduce noise to achieve the object of quietness. Additionally, since this miniature fluid control device is small and slim it is light and portable for using in the wearable device.

Moreover, under the operation of the suspension plate of the piezoelectric actuator which is a square plate with the bulge, the fluid is introduced into the inlet of the gas inlet plate of the base, guided to the central cavity through the convergence channel, and then transferred to the compressible chamber between the resonance plate and the piezoelectric actuator through the central aperture of the resonance plate. Consequently, a pressure gradient is generated in the compressible chamber to facilitate the fluid to flow at a high speed. Since the flow rate is not reduced and no pressure loss is generated, the volume of the compressible chamber can be compressed more effectively, and result in higher discharge pressure. Due to the slim, silent and power-saving benefits, the miniature fluid control device of the present invention is suitably used in the wearable device. In other words, the miniature fluid control device of the present invention has significant industrial values.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A piezoelectric actuator, comprising:
a suspension plate having a square shape and with a central portion and a periphery portion, wherein the suspension plate is permitted to undergo a curvy vibration from the central portion to the periphery portion, wherein the length of the suspension plate is in a range between 9 mm and 10 mm, and the thickness of the suspension plate is 0.27 mm;
an outer frame arranged around the suspension plate;
a plurality of brackets, wherein each of the plurality of brackets has two ends, a first end is perpendicular to and connected with the suspension plate, and a second end is perpendicular to and connected with the outer frame for elastically supporting the suspension plate, and each bracket has a length of 1.30 mm, and a width in a range of 0.45 mm; and
a piezoelectric ceramic plate having a square shape, wherein a length of a side of the piezoelectric ceramic plate is equal to or less than a length of a side of the suspension plate, and the piezoelectric ceramic plate is attached on a first surface of the suspension plate to drive the suspension plate to undergo the curvy vibration when a voltage is applied to the piezoelectric ceramic plate.

2. The piezoelectric actuator according to claim 1, wherein the a plurality of brackets are four brackets.

3. The piezoelectric actuator according to claim 1, wherein the first end of each bracket is perpendicular to and connected with a lateral rim of the suspension plate, and the second end of the bracket is perpendicular to and connected with an inner rim of the outer frame.

4. The piezoelectric actuator according to claim 1, wherein a thickness of the piezoelectric ceramic plate is in a range between 0.05 mm and 0.3 mm.

5. The piezoelectric actuator according to claim 4, wherein the thickness of the piezoelectric ceramic plate is 0.10 mm.

* * * * *